(12) United States Patent
Tsai et al.

(10) Patent No.: US 11,565,934 B2
(45) Date of Patent: Jan. 31, 2023

(54) SEMICONDUCTOR PACKAGE STRUCTURES AND METHODS OF MANUFACTURING THE SAME

(71) Applicant: Advanced Semiconductor Engineering, Inc., Kaohsiung (TW)

(72) Inventors: Yu-Hsuan Tsai, Kaohsiung (TW); Lu-Ming Lai, Kaohsiung (TW); Chien-Wei Fang, Kaohsiung (TW); Ching-Han Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 216 days.

(21) Appl. No.: 16/734,060

(22) Filed: Jan. 3, 2020

(65) Prior Publication Data

US 2021/0206628 A1 Jul. 8, 2021

(51) Int. Cl.
*B81B 7/00* (2006.01)
*B81C 1/00* (2006.01)

(52) U.S. Cl.
CPC ........ *B81B 7/0048* (2013.01); *B81C 1/00325* (2013.01); *B81B 2207/098* (2013.01)

(58) Field of Classification Search
CPC .................... B81B 7/0048; H01L 23/49575
See application file for complete search history.

(56) References Cited

U.S. PATENT DOCUMENTS

| | | | |
|---|---|---|---|
| 2003/0102575 A1* | 6/2003 | Minamio | H01L 21/561 257/787 |
| 2009/0108423 A1* | 4/2009 | Riedl | H01L 23/4334 257/675 |
| 2016/0183369 A1* | 6/2016 | Talledo | H05K 1/181 361/767 |
| 2019/0206772 A1* | 7/2019 | How | H01L 23/49805 |

* cited by examiner

*Primary Examiner* — Moazzam Hossain
(74) *Attorney, Agent, or Firm* — Foley & Lardner LLP

(57) ABSTRACT

A semiconductor package structure includes a die paddle, a plurality of leads, an electronic component and a package body. Each of the plurality of leads is separated from the die paddle and has an inner side surface facing the die paddle. The electronic component is disposed on the die paddle. The package body covers the die paddle, the plurality of leads and the electronic component. The package body is in direct contact with a bottom surface of the die paddle and the inner side surface of the plurality of leads.

20 Claims, 16 Drawing Sheets

SEMICONDUCTOR PACKAGE STRUCTURES AND METHODS OF MANUFACTURING THE SAME

BACKGROUND

1. Field of the Disclosure

The present disclosure relates to semiconductor package structures and methods of manufacturing the same.

2. Description of Related Art

A MEMS device (as used herein, the term "MEMS" may refer to a singular microelectromechanical system or to a plurality of microelectromechanical systems) is a semiconductor element integrated into a chip through microminiaturization. As mobile devices such as smartphones and tablets become increasingly popular, MEMS devices have been receiving much attention.

A MEMS device generally includes a die, a lead frame and a molding compound. Since the CTE (coefficient of thermal expansion) of a molding compound is significantly different from that of a lead frame, thermal stress may be generated due to temperature change, especially in a reflow process. It is desirable to reduce the stress in MEMS devices to improve their performance.

SUMMARY

According to some embodiments of the present disclosure, a semiconductor package structure includes a die paddle, a plurality of leads, an electronic component and a package body. Each of the plurality of leads is separated from the die paddle and has an inner side surface facing the die paddle. The electronic component is disposed on the die paddle. The package body covers the die paddle, the plurality of leads and the electronic component. The package body is in direct contact with a bottom surface of the die paddle and the inner side surface of the plurality of leads.

According to some embodiments of the present disclosure, a semiconductor package structure includes a first dielectric layer, a plurality of leads, a die paddle, an electronic component, a plurality of wire bonds and a second dielectric layer. The plurality of leads are disposed abutting a lateral surface of the first dielectric layer. The die paddle is disposed on the first dielectric layer and separated from the plurality of leads. The electronic component is disposed on a top surface of the die paddle. The plurality of wire bonds are electrically connected to the electronic component and the plurality of leads. The second dielectric layer encapsulates the plurality of leads, the die paddle, the electronic component and the wire bonds.

According to some embodiments of the present disclosure, a method of manufacturing a semiconductor package structure includes: providing a lead frame including a die paddle and a plurality of leads separated from the die paddle; disposing an electronic component on a top surface of the die paddle and electrically connecting the electronic component to the plurality of leads; and forming a package body covering the die paddle, the plurality of leads and the electronic component to produce the semiconductor package structure. A bottom surface of the die paddle is higher than bottom surfaces of the plurality of leads.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Figure 1A:
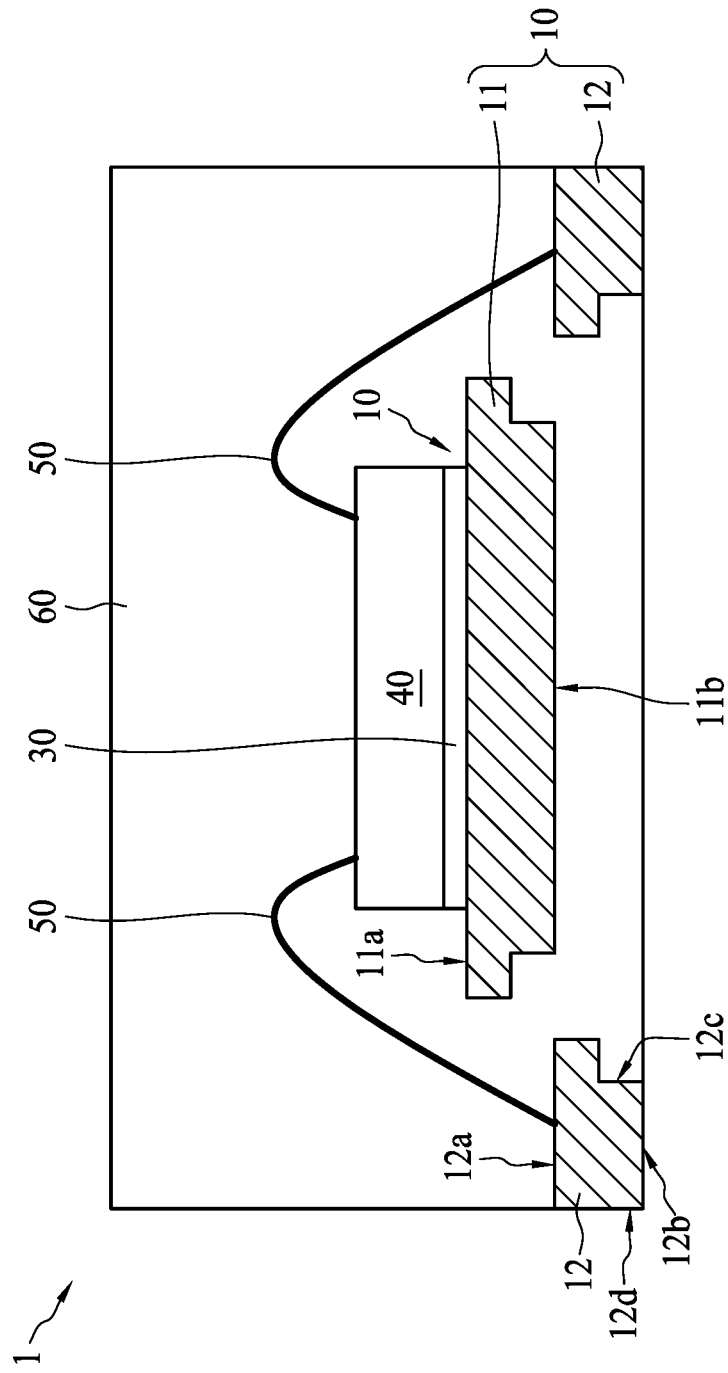
FIG. 1A is a cross-section of a semiconductor package structure in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

The present disclosure describes techniques suitable for the manufacture of semiconductor package structures with an encapsulant (e.g., a molding compound) sealing the bottom surface of a die paddle of a lead frame, which can reduce stress on an electronic component disposed on the lead frame. In comparative embodiments, the encapsulant covers the electronic component and the lead frame and exposes a bottom surface of the leads of the lead frame and a bottom surface of the die paddle of the lead frame, and bumps are attached to the bottom surface of the leads and the bottom surface of the die paddle for electrical connection and heat dissipation; however, significant stress will be generated due to a difference in the CTE between the die paddle and the encapsulant. Compared to the semiconductor package structures in comparative embodiments, in some embodiments according to the present disclosure, the bottom surface of the die paddle is higher than the bottom surface of lead of the lead frame, the encapsulant covers not only the electronic component disposed on an upper surface of the die paddle but also the bottom surface of a die paddle, and it has been found that the stress generated by a difference in the CTE between the die paddle and the encapsulant on the electronic component can be effectively reduced. In some embodiments according to the present disclosure, the bump(s) disposed on the bottom surface of the die paddle can be omitted, which can further reduce the stress on the electronic component and improve the performance of the semiconductor package structure.

FIG. 1A is a cross-section of a semiconductor package structure 1 in accordance with some embodiments of the present disclosure. As shown in FIG. 1, the semiconductor package structure 1 includes a lead frame 10, an electronic component 40 and a package body 60.

The lead frame 10 may include a die paddle 11 and a plurality of leads 12 separated from the die paddle 11. The die paddle 11 and the lead 12 can be made of copper, copper alloy or another suitable metal or alloy. In some embodiments, the die paddle 11 and the lead 12 may include one or a combination of the following: iron, nickel, iron alloy, nickel alloy or any other suitable metal or metal alloy.

The die paddle 11 may include a surface 11a and a surface 11b opposite to the surface 11a. Each lead 12 may include a surface 12a and a surface 12b opposite to the surface 12a. In some embodiments, the surface 11b of the die paddle 11 is not coplanar with the surface 12b of the lead 12. In some embodiments, the surface 11b of the die paddle 11 is higher than the surface 12b of the lead 12. In some embodiments, the surface 11b of the die paddle 11 is higher than the surface 12a of the lead 12. In some embodiments, the surface 11b of the die paddle 11 is coplanar with the surface 12a of the lead 12. In addition, each of the plurality of leads 12 has a surface 12c facing the die paddle 11 (e.g., inner side surface or inner lateral surface) and a surface 12d opposite to the surface 12c (e.g., outer side surface or outer lateral surface).

The electronic component 40 is disposed on the surface 11a of the die paddle 11. The electronic component 40 may include one or more semiconductor dies in the form of one or more integrated circuits (ICs) (such as packaged semiconductor dies). In some embodiments, the electronic component 40 may include, but is not limited to, at least one active component such as MEMS die or another active component. In some embodiments, the electronic component 40 may be or include, but is not limited to, one or more gyroscopes, accelerometers, pressure sensors, microphones, actuators, mirrors, heaters, printer nozzles magnetometers, or a combination of two or more thereof. In some embodiments, the electronic component 40 may include, but is not limited to, at least one passive component such as a capacitor, a resistor, or another passive component.

In some embodiments, the semiconductor package structure 1 may include an adhesive element 30 configured to attach the electronic component 40 to the surface 11a of the die paddle 11. The adhesive element 30 may include or be formed of a die attach film (DAF). For example, the adhesive element 30 may include one or more epoxy resins.

In some embodiments, the semiconductor package structure 1 may include wire bonds 50 configured to electrically connect the electronic component 40 and the leads 12. The wire bond 50 may include or be made of metal materials, such as copper (Cu), silver (Ag), aluminum (Al), gold (Au), or an alloy thereof.

The package body 60 covers the die paddle 11 and the leads 12 of the lead frame 10 as well as the electronic component 40. The package body 60 is an encapsulant and may include insulation or dielectric material. In some embodiments, the package body 60 is made of molding material that may include, for example, a Novolac-based resin, an epoxy-based resin, a silicone-based resin, or other another suitable encapsulant. Suitable fillers may also be included, such as powdered $SiO_2$.

In some embodiments, the surface 12d of the lead 12 is exposed from the package body 60. In some embodiments, the surface 12d of the lead 12 is coplanar with the lateral surface of the package body 60. In some embodiments, the package body 60 is in direct contact with the surface 11b of the die paddle 11 and the surface 12c of the lead 12. In some embodiments, the package body 60 is in direct contact with the surfaces 11a and 11b of the die paddle 11 and the surfaces 12a and 12c of the lead 12. In some embodiments, the package body 60 is formed in one piece. More specifically, there is no boundary of the package body 60 between the surface 12a of the lead 12 and the surface 11b of the die paddle 11. In some embodiments, the surface 11b of the die paddle 11 is sealed or completely sealed by the package body 60. In some embodiments, a portion of the package body 60 is disposed below the surface 11b of the die paddle 11.

Figure 1B:
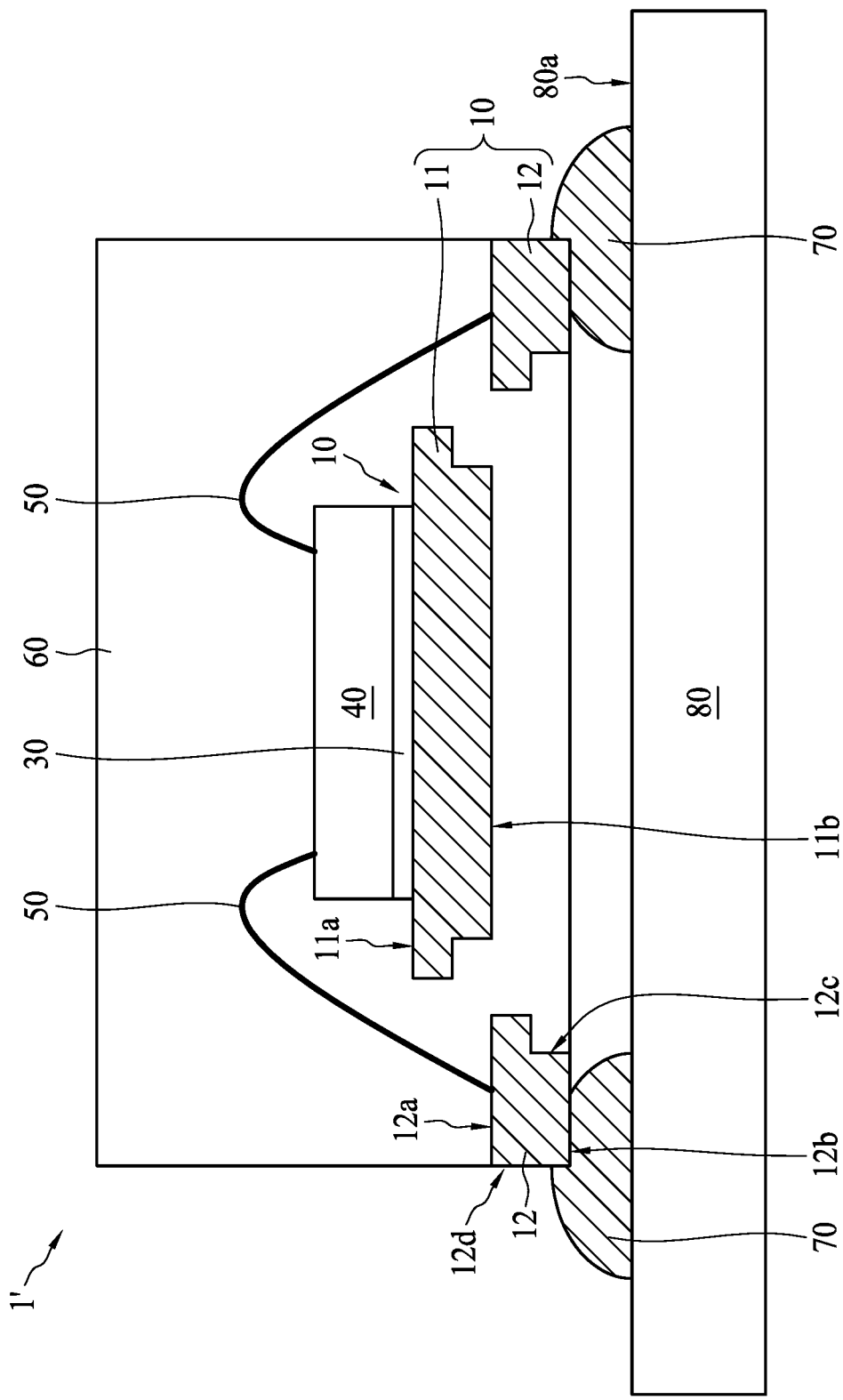
FIG. 1B is a cross-section of another semiconductor package structure in accordance with some embodiments of the present disclosure.

FIG. 1B is a cross-section of another semiconductor package structure 1' in accordance with some embodiments of the present disclosure. The semiconductor package structure 1' of FIG. 1B has a similar structure to that of the semiconductor package structure 1 of FIG. 1A except that the semiconductor package structure 1' further includes bumps 70 and a printed circuit board 80.

In some embodiments, the bumps 70 are disposed to contact the surface 12b and the surface 12d of the lead 12. The bumps 70 are configured to electrically connect the leads 12 and the printed circuit board 80 so that the electronic component 40 can be electrically connected to the printed circuit board 80. The bump 70 may be a solder ball (e.g., Sn ball).

The printed circuit board 80 may include a paper-based copper foil laminate, a composite copper foil laminate, or a polymer-impregnated glass-fiber-based copper foil laminate. The printed circuit board 80 may include a redistribution layer (RDL) or traces; for example, the RDL may be composed of multiple dielectric layers, metal layers and/or through-holes.

In some embodiments, a portion of the package body 60 is disposed between the electronic component 40 and the printed circuit board 80. In some embodiments, there is no active element, such as semiconductor die, disposed between the surface 11b of the die paddle 11 and a surface 80a of the printed circuit board 80.

In some embodiments, there is no bump disposed directly on the surface 11b of the die paddle 11. In some embodiments, there is no bump disposed directly on the bottom surface, directly below the die paddle 11, of the package body 60. In comparative embodiments as discussed above, stress may be generated from an interface between the bump and the die paddle due to a reflow process for producing the bump, and then the stress may be transmitted to the electronic component through the bump and the die paddle. According to some embodiments of the present disclosure, since no bump is disposed directly on the surface 11b of the die paddle 11, the stress generated from the interface between the bump and die paddle can be decreased. Therefore, the stress on the electronic component 40 is reduced, thereby improving the performance of the semiconductor package structure 1.

Figure 2:
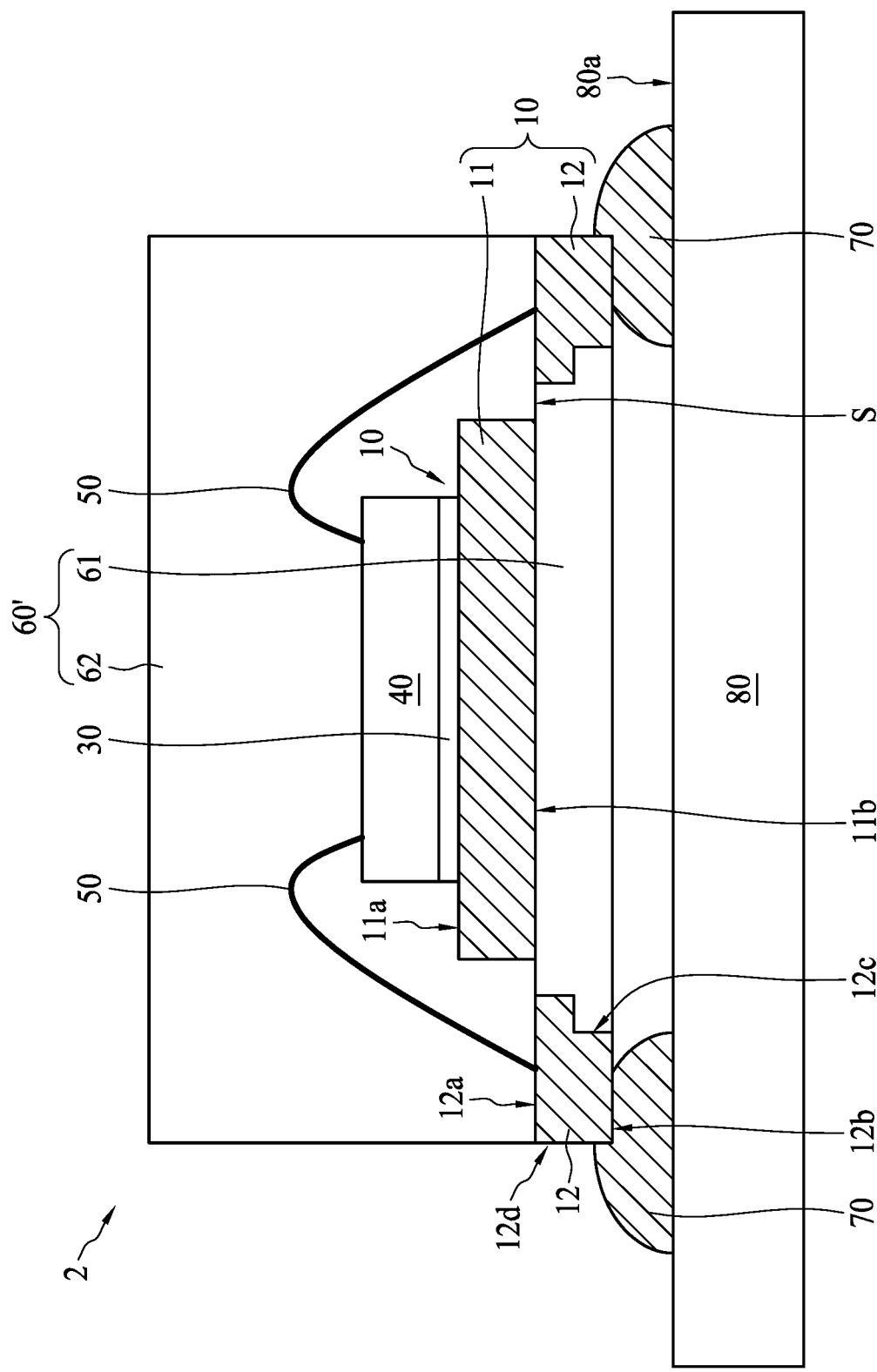
FIG. 2 is a cross-section of another semiconductor package structure in accordance with some embodiments of the present disclosure.

FIG. 2 is a cross-section of another semiconductor package structure 2 in accordance with some embodiments of the present disclosure. The semiconductor package structure 2 of FIG. 2 has a similar structure to that of the semiconductor package structure 1' of FIG. 1B except with respect to the package body 60'.

In some embodiments, the package body 60' may include a dielectric layer 61 and a dielectric layer 62. In some embodiments, the leads are disposed abutting a lateral surface of the dielectric layer 61. That is, the dielectric layer 61 is disposed between the plurality of leads 12. In some embodiments, the dielectric layer 61 is disposed under the surface 11b of the die paddle 11. In some embodiments, the dielectric layer 61 is in direct contact with the die paddle 11. More specifically, the dielectric layer 61 is in direct contact with the surface 11b of the die paddle 11. In some embodiments, the dielectric layer 61 is in direct contact with the lead 12. More specifically, the dielectric layer 61 is in direct contact with the surface 12c of the lead 12. In some embodiments, the surface 11b of the die paddle 11 is sealed or completely sealed by the dielectric layer 61. In some embodiments, the surface 12c of the lead 12 is sealed or completely sealed by the dielectric layer 61. The dielectric layer 61 has a top surface at a first height; the surface 12a of the lead 12 is of a second height. In some embodiments, the first height exceeds the second height. In some embodiments, the first height is substantially the same as the second height. In some embodiments, the first height is less than the second height. In some embodiments, the top surface of the dielectric layer 61 is higher than the surface 12b and lower than the surface 12a of the lead 12.

The dielectric layer 62 is disposed on the dielectric layer 61. The dielectric layer 62 covers the die paddle 11 and the electronic component 40. In some embodiments, the surface 12d of the lead 12 is exposed from the dielectric layer 62. In some embodiments, the surface 12d of the lead 12 is coplanar with the lateral surface of the dielectric layer 62. The dielectric layer 62 and the dielectric layer 61 may be made of an insulation or dielectric material as discussed above. In some embodiments, the dielectric layer 62 and the dielectric layer 61 are made of a same material. In some embodiments, the dielectric layer 62 and the dielectric layer 61 are made of different materials. In some embodiments, the dielectric layer 61 and the dielectric layer 62 are formed in different steps. In some embodiments, the package body 60' has a boundary S at an interface between the dielectric layer 61 and the dielectric layer 62. In some embodiments, the boundary S may be formed between the surface 12a of the lead 12 and the surface 11b of the die paddle 11.

According to some embodiments of the present disclosure, since no bump is disposed directly on the bottom surface, directly below the die paddle 11, of the package body 60', the stress generated from the interface between the bump and the die paddle can be decreased. Therefore, stress on the electronic component 40 is reduced, thereby improving the performance of the semiconductor package structure 2.

Figure 3A:
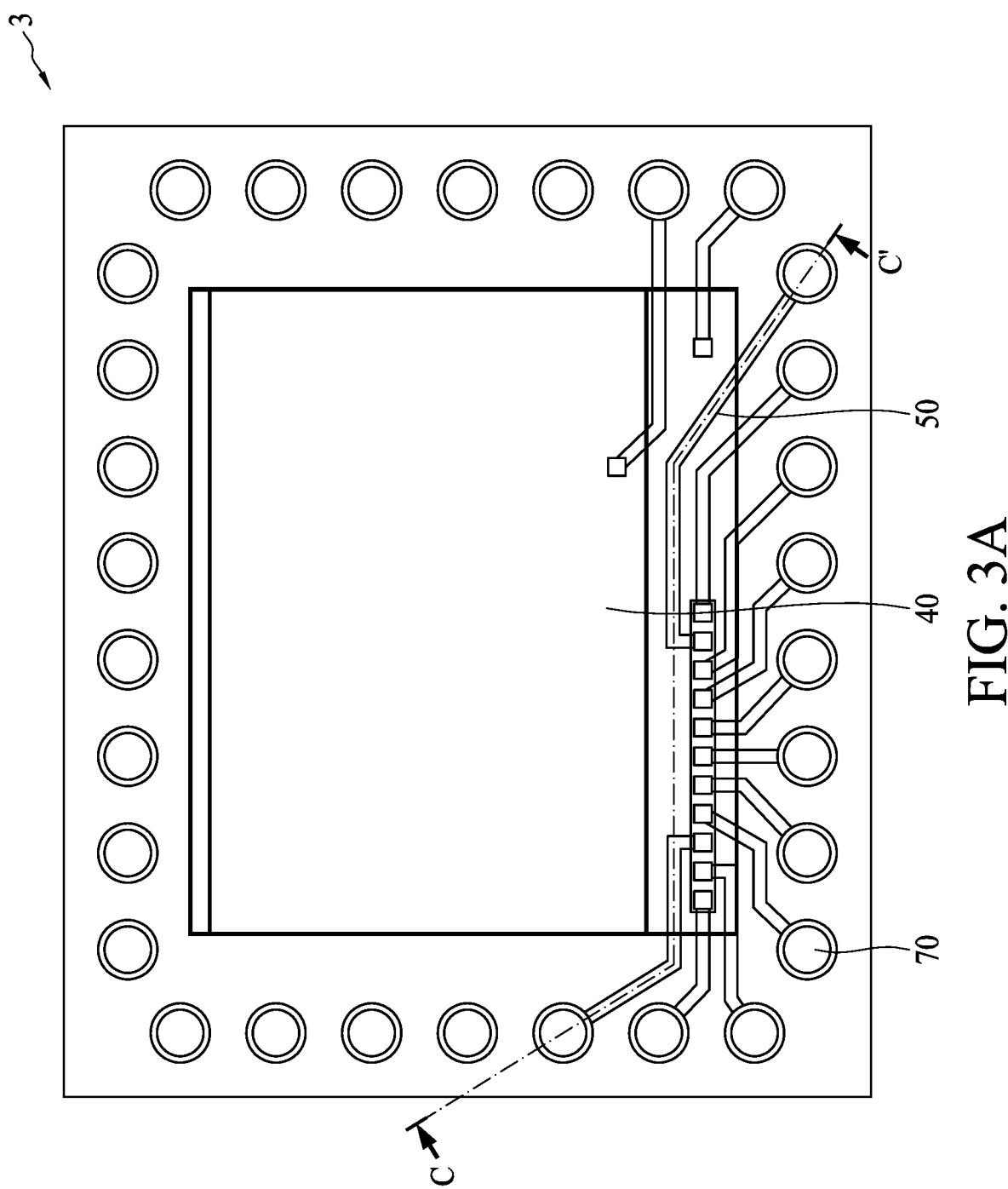
FIG. 3A is a top view of another semiconductor package structure in accordance with some embodiments of the present disclosure.
Figure 3B:
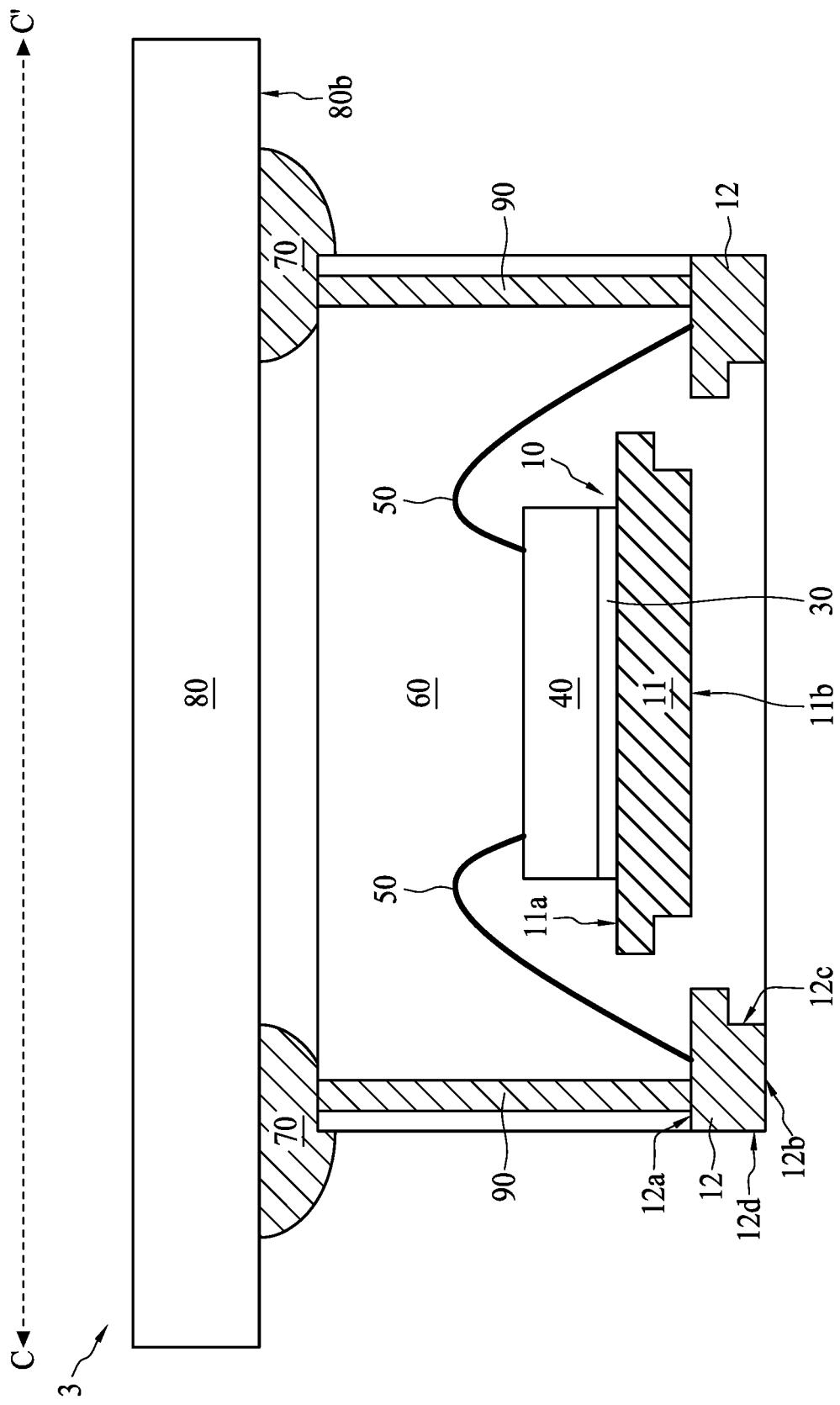
FIG. 3B is a cross-section of the semiconductor package structure in accordance with some embodiments of the present disclosure as illustrated in FIG. 3A.

FIG. 3A is a top view of another semiconductor package structure 3 in accordance with some embodiments of the present disclosure; FIG. 3B is a cross-section along the line C-C' of the semiconductor package structure 3 shown in FIG. 3A. The semiconductor package structure 3 of FIG. 3B has a similar structure to that of the semiconductor package structure 1' of FIG. 1B except that the position of the bumps 70 and the printed circuit board 80.

In some embodiments, the bumps 70 and the printed circuit board 80 are disposed over the surface 11a of the die paddle 11 and the surface 12a of the leads 12. The bumps 70 are not in direct contact with the leads 12. The bumps 70 are disposed on a top surface of the package body 60 and attached to a surface 80b of the printed circuit board 80. The surface 80b faces a top surface of the package body 60. As shown in FIG. 3A, the bumps 70 may surround the electronic component 40.

In some embodiments, the semiconductor package structure 3 may further include an electrical connection member 90 as shown in FIG. 3B. The electrical connection member 90 is configured to electrically connect the bump 70 with a respective one of the leads 12. The electrical connection member 90 may penetrate the package body 60 to the surface 12a of the lead 12. The material of the electrical connection member 90 may include copper (Cu), tin (Sn), silver (Ag), nickel (Ni), or a combination of two or more thereof.

In some embodiments, a portion of the package body 60 is disposed between the electronic component 40 and the printed circuit board 80. In some embodiments, no bump is disposed on the top surface, directly above the electronic component 40, of the package body 60, which can reduce the stress due to the difference of the CTE between the bump and the encapsulant; therefore, the stress on the electronic component 40 is decreased, thereby improving the performance of the semiconductor package structure 3.

Figure 4A:
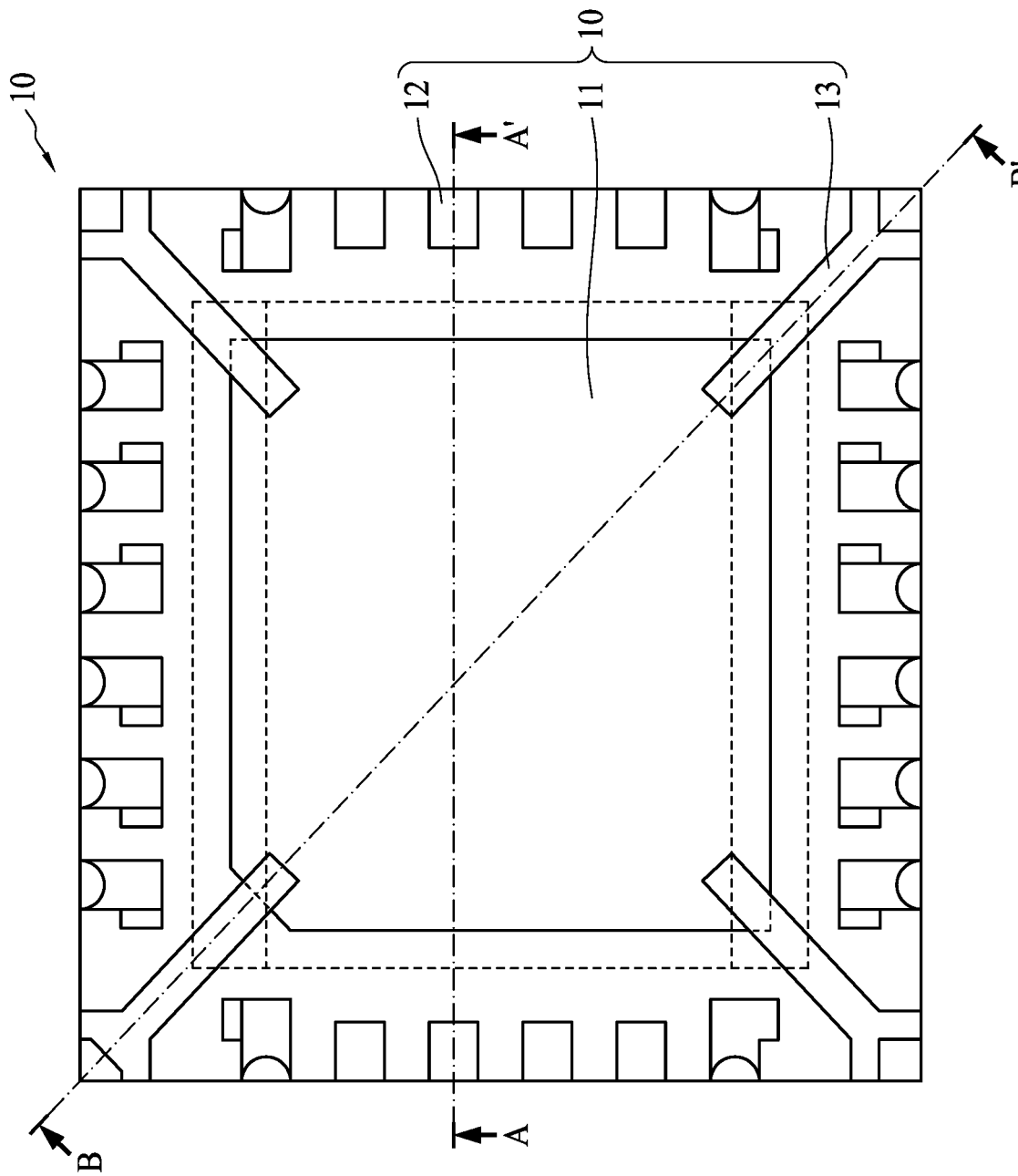
FIG. 4A, FIG. 4A(a), FIG. 4A(b)
Figure 4A:
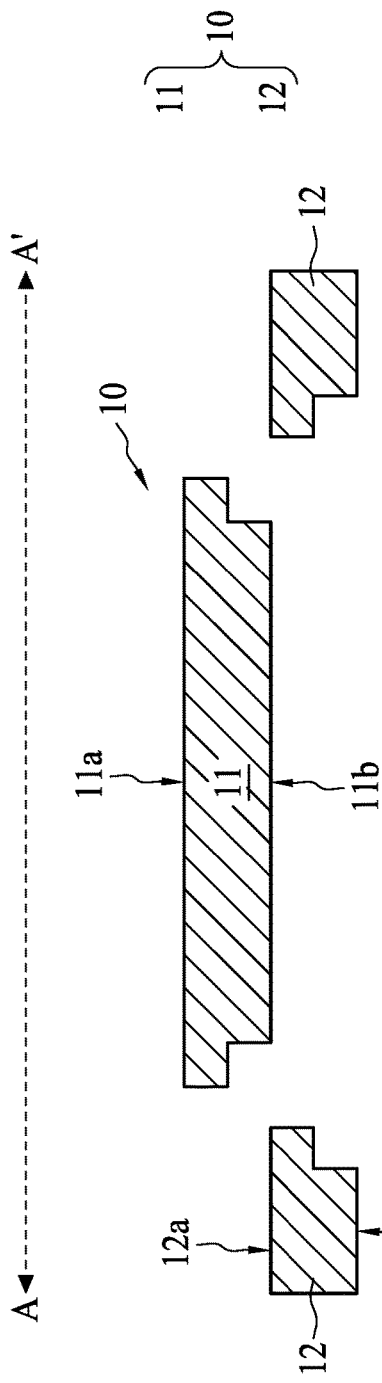
Figure 4A:
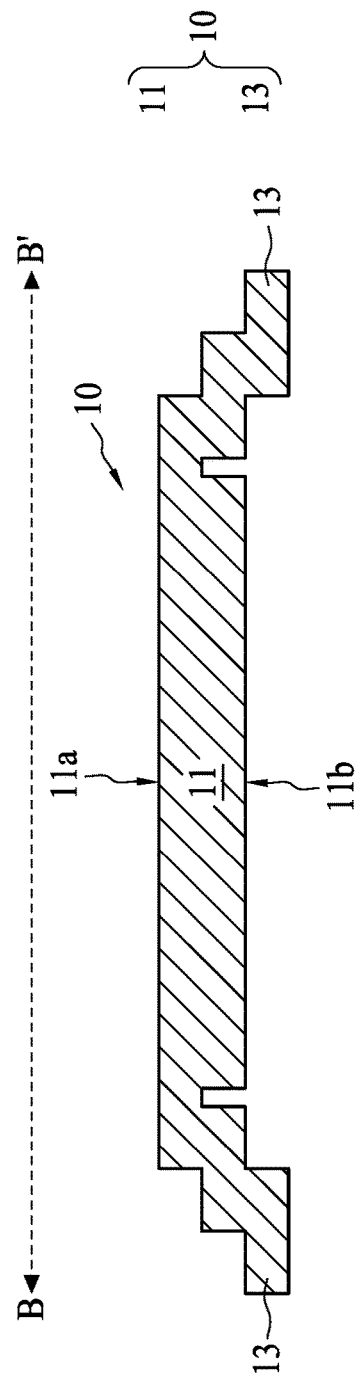

FIG. 4A, FIG. 4A(a), FIG. 4A(b), FIG. 4B, FIG. 4C, FIG. 4D and FIG. 4E illustrate various stages of a method for manufacturing the semiconductor package structure 1 or 1' in accordance with some embodiments of the present disclosure.

Referring to FIG. 4A, FIG. 4A(a), FIG. 4A(b), a lead frame 10 is provided. FIG. 4A is a top view of the lead frame 10. FIG. 4A(a) is a cross-section of the lead frame 10 along the line A-A' of FIG. 4A; FIG. 4A(b) is a cross-section of the lead frame 10 along the line B-B' of FIG. 4A.

The lead frame 10 may include a die paddle 11, a plurality of leads 12, and a plurality of tie bars 13. As shown in FIG. 4A, the leads 12 may surround and be separated from the die paddle 11. In some embodiments, the tie bars 13 may connect the die paddle 11 and be disposed on the four corners of the lead frame 10. In some embodiments, the tie bars 13 are disposed on the four sides of the lead frame 10.

As shown in FIG. 4A(a), the die paddle 11 may include a surface 11a and a surface 11b opposite to the surface 11a. The lead 12 may include a surface 12a and a surface 12b opposite to the surface 12a. In some embodiments, the surface 11b of the die paddle 11 is not coplanar with the surface 12b of the lead 12. In some embodiments, the surface 11b of the die paddle 11 is higher than the surface 12b of the lead 12. In some embodiments, the surface 11b of the die paddle 11 is higher than or coplanar with the surface 12a of the lead 12.

As shown in FIG. 4A(b), the tie bar 13 may be, but is not limited to being, composed of multiple L-shaped sections. The surface 11b of the die paddle 11 may be higher than the bottom surface of the tie bar 13. The surface 11a of the die paddle 11 may be substantially coplanar with the top surface of the tie bar 13. In some embodiments, the tie bar 13 can be designed so that the die paddle 11 can be maintained at a predetermined height (e.g., the surface 11b of the die paddle 11 is higher than the surface 12b of the lead 12).

Figure 4B:
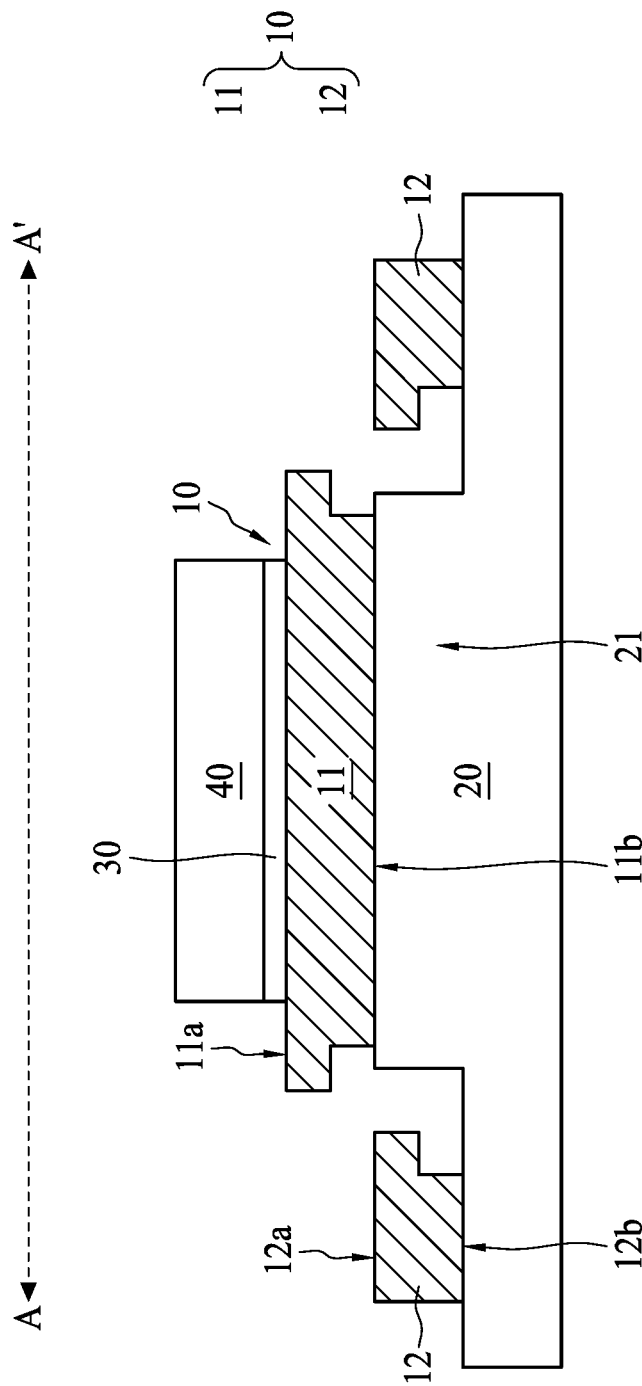
FIG. 4B, FIG. 4C, FIG. 4D and FIG. 4E illustrate various stages of a method for manufacturing a semiconductor package structure in accordance with some embodiments of the present disclosure.

Referring to FIG. 4B, the lead frame 10 is disposed on a process kit 20, and then the electronic component 40 is disposed on the die paddle 11, for example, through an adhesive element 30. In some embodiments, the process kit 20 may have a protrusion 21 on the center portion of the process kit 20, the die paddle 11 is disposed on the protrusion 21 and the leads 12 are disposed on the periphery of the process kit 20. In some embodiments, the top surface of the protrusion 21 may be higher than the surface 12a of the lead 12. In some embodiments, the top surface of the protrusion 21 may be substantially coplanar with the surface 12a of the lead 12.

The adhesive element 30 is disposed on the surface 11a of the die paddle 11. The electronic component 40 is bonded to the surface 11a of the die paddle 11 through the adhesive element 30. The use of the process kit 20 may prevent the die paddle 11 and the tie bar 13 from breaking when the electronic component 40 is bonded to the die paddle 11.

Figure 4C:
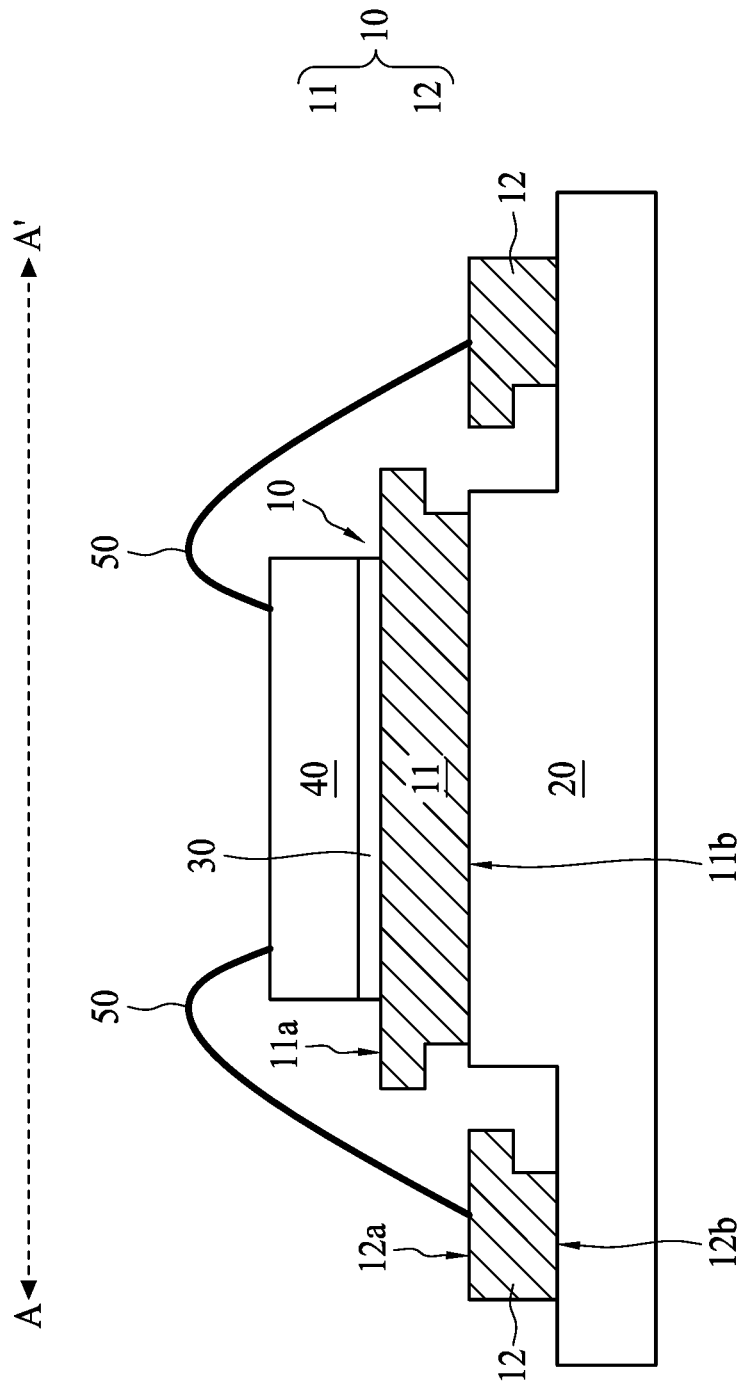

Referring to FIG. 4C, the wire bonds 50 are formed to connect the lead 12 and the electronic component 40. Two terminals of the wire bond 50 may be disposed on the top surface of the electronic component 40 and on the surface 12a of the lead 12, respectively. The electronic component 40 is electrically connected to the leads 12 through the wire bonds 50. In some embodiments, a plasma process may be performed so as to clean the surfaces of the electronic component 40 and the lead 12 before the formation of the wire bonds 50.

Figure 4D:
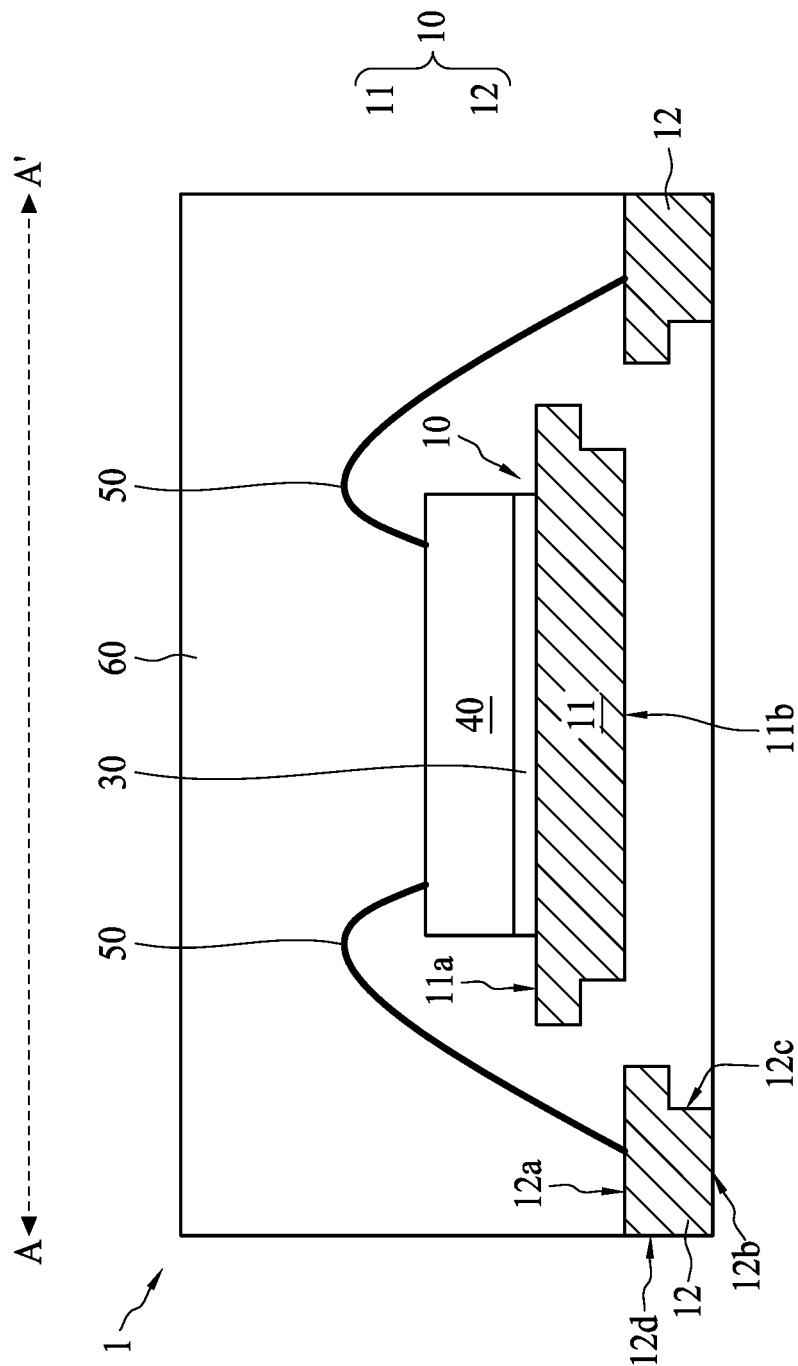

Referring to FIG. 4D, the package body 60 is formed so as to produce the semiconductor package structure 1. The package body 60 is formed, for example, by molding a compound to encapsulate the lead frame 10, the electronic component 40 and the wire bonds 50. The process kit 20 is removed before the formation of the package body 60. In some embodiments, the package body 60 is formed in one piece. That is, the package body 60 is produced in one step or one process. The package body 60 is in direct contact with the surface 11b of the die paddle 11 and the surface 12c of the lead 12. Since the package body 60 is a single piece, there is no boundary of the package body 60 between the surface 12a of the lead 12 and the surface 11b of the die paddle 11.

Figure 4E:
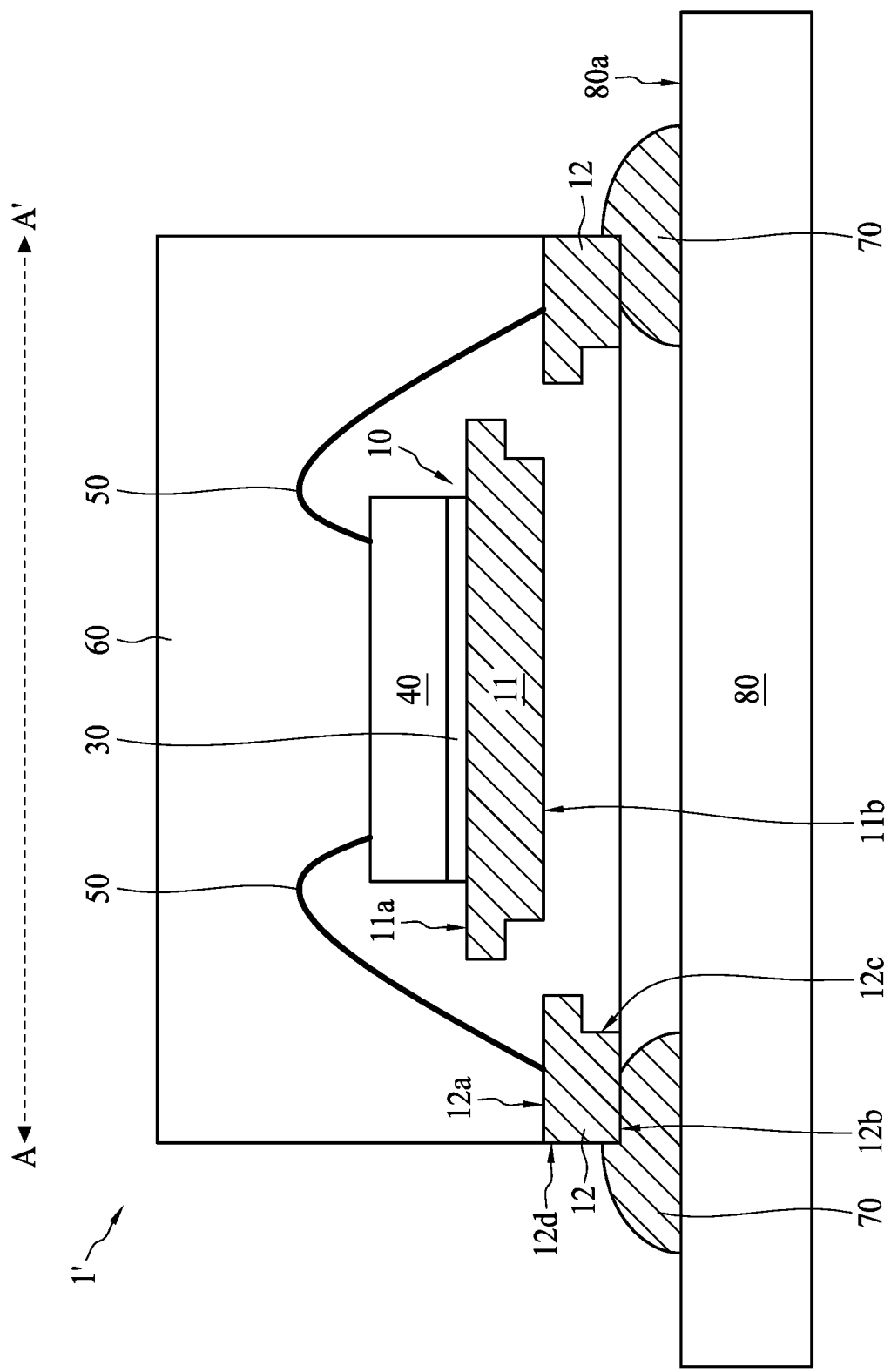

Referring to FIG. 4E, a reflow process is performed to connect the leads 12 and the bumps 70. The printed circuit board 80 is bonded to the bumps 70 so as to produce the semiconductor package structure P. Since no bump is disposed on the surface 11b of the die paddle 11, the stress generated at the interface between the bump and the die paddle 11 is reduced. That is, the surface 11b of the die paddle 11 being higher than the surface 12b of the lead 12 assists in improving the performance of the semiconductor package structure 1 or P.

FIG. 5A, FIG. 5B, FIG. 5C, FIG. 5D, FIG. 5E and FIG. 5F illustrate various stages of a method for manufacturing the semiconductor package structure 2 in accordance with some embodiments of the present disclosure. In these embodiments, the lead frame 10 may include a die paddle 11 and a plurality of leads 12 without tie bars.

Figure 5A:
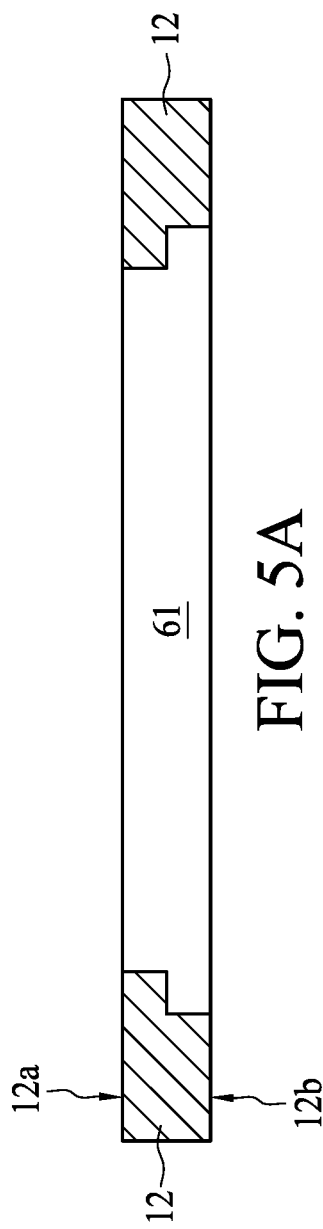
FIG. 5A, FIG. 5B, FIG. 5C, FIG. 5D, FIG. 5E and FIG. 5F illustrate various stages of another method for manufacturing a semiconductor package structure in accordance with some embodiments of the present disclosure.

Referring to FIG. 5A, the dielectric layer 61 is formed, for example, by using a molding compound. The dielectric layer 61 is surrounded by the lead 12. In some embodiments, the top surface of the dielectric layer 61 is substantially coplanar with the surface 12a of the lead 12. In some embodiments, the top surface of the dielectric layer 61 is lower than the surface 12a of the lead 12. In some embodiments, the top surface of the dielectric layer 61 is higher than the surface 12a of the lead 12.

Figure 5B:
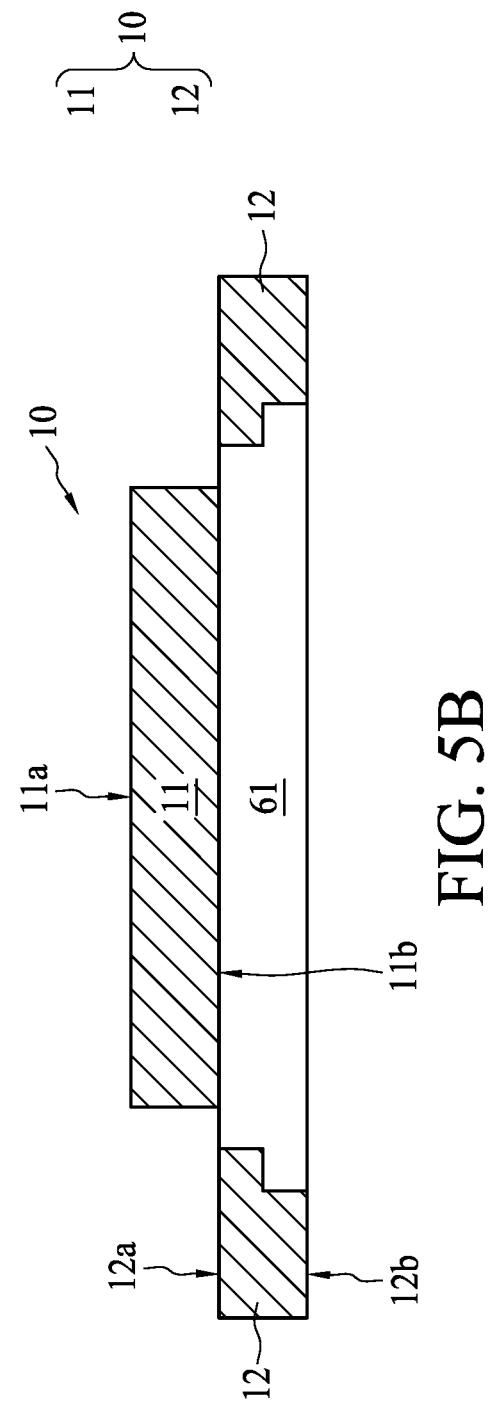

Referring to FIG. 5B, the die paddle 11 is then disposed on the top surface of the dielectric layer 61. In some embodiments, the surface 11b of the die paddle 11 is substantially coplanar with the surface 12a of the lead 12. In some embodiments, the surface 11b of the die paddle 11 is higher than the surface 12a of the lead 12. In some embodiments, the surface 11b of the die paddle 11 is lower than the surface 12a of the lead 12. In some embodiments, the surface 11b of the die paddle 11 is higher than the surface 12b of the lead 12. In some embodiments, the die paddle 11 is in direct contact with the dielectric layer 61.

Figure 5C:
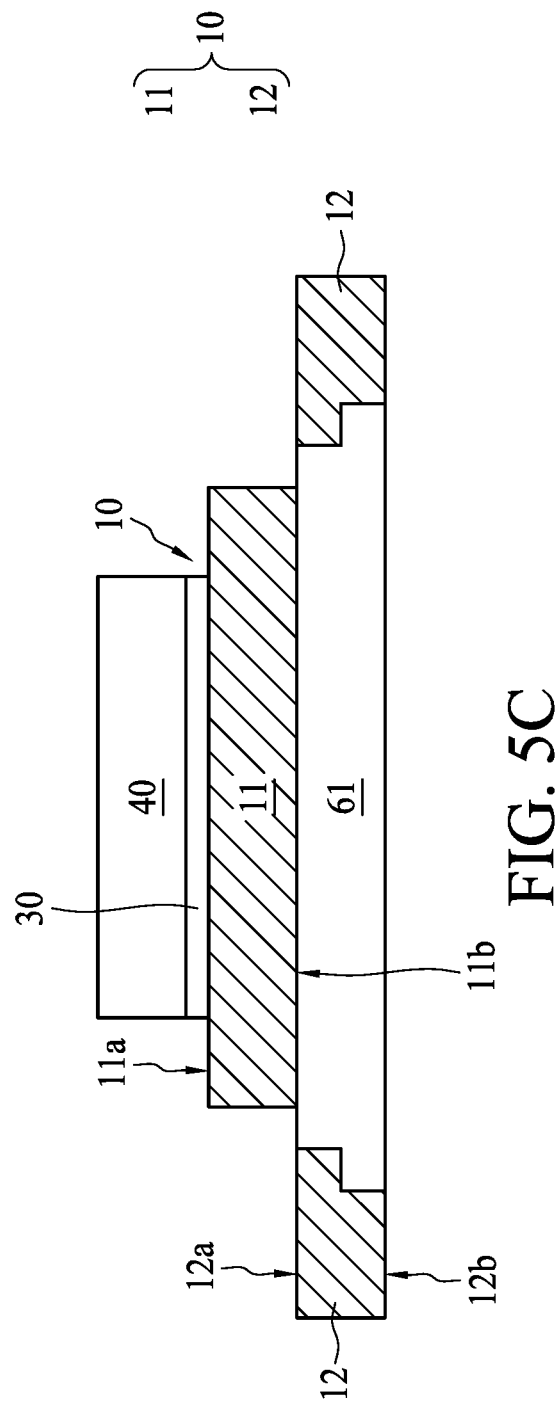

Referring to FIG. 5C, the adhesive element 30 is disposed on the surface 11a of the die paddle 11. The electronic component 40 is bonded to the surface 11a of the die paddle 11 through the adhesive element 30.

Figure 5D:
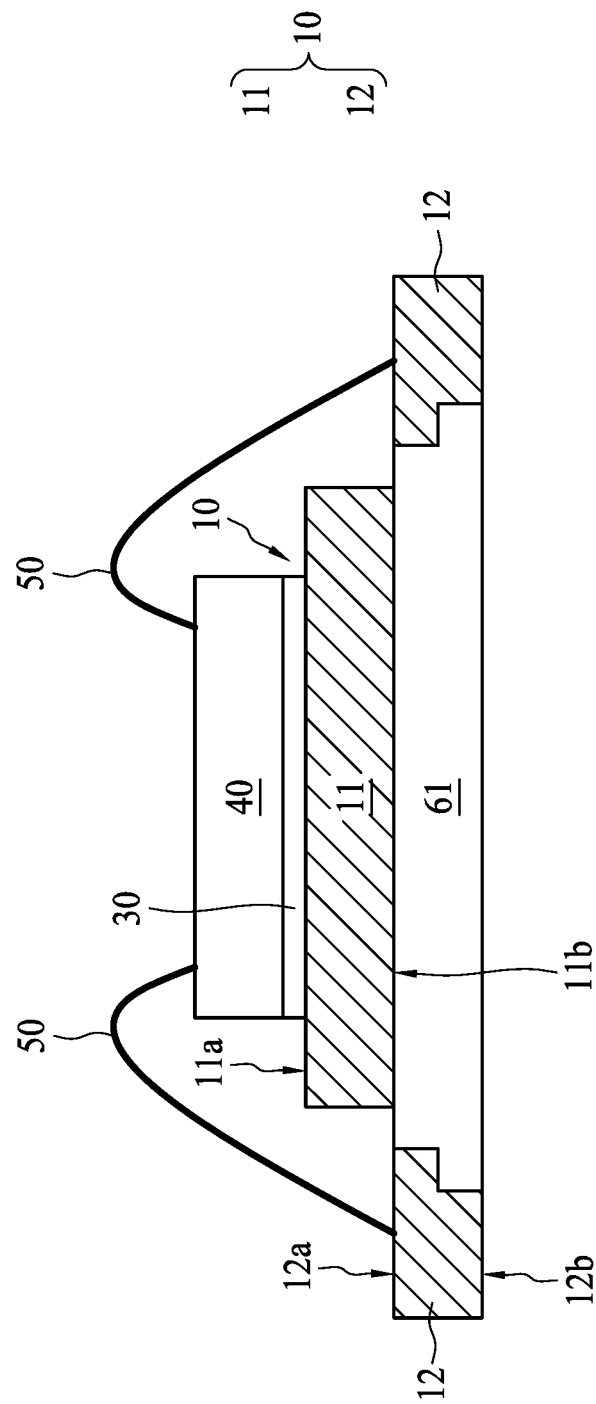

Referring to FIG. 5D, the wire bonds 50 are formed to connect the leads 12 and the electronic component 40. Two terminals of the wire bond 50 may be disposed on the top surface of the electronic component 40 and on the surface 12a of the lead 12, respectively. The electronic component 40 is electrically connected to the leads 12 through the wire bond 50. In some embodiments, a plasma process may be performed so as to clean the surfaces of the electronic component 40 and the leads 12 before the formation of the wire bond 50.

Figure 5E:
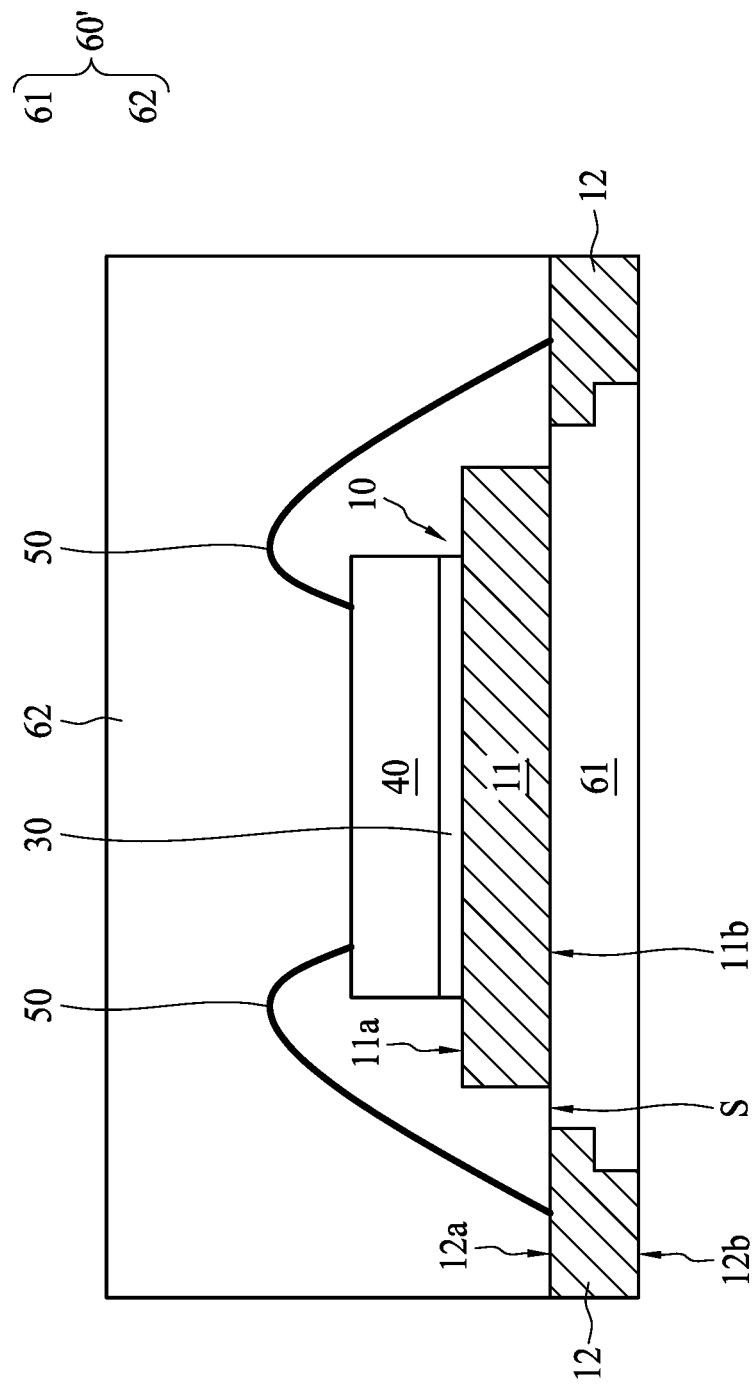

Referring to FIG. 5E, the dielectric layer 62 is formed, for example, by molding a compound to encapsulate the lead frame 10, the electronic component 40, and the wire bond 50. In some embodiments, the material of the dielectric layer 62 is the same as that of the dielectric layer 61. In some embodiments, the dielectric layer 62 and the dielectric layer 61 are formed in different steps or in different processes; therefore, the package body 60' has a boundary S at an interface between the dielectric layers 61 and 62. As shown in FIG. 5E, the boundary S may be formed between the surface 12a of the lead 12 and the surface 11b of the die paddle 11.

Figure 5F:
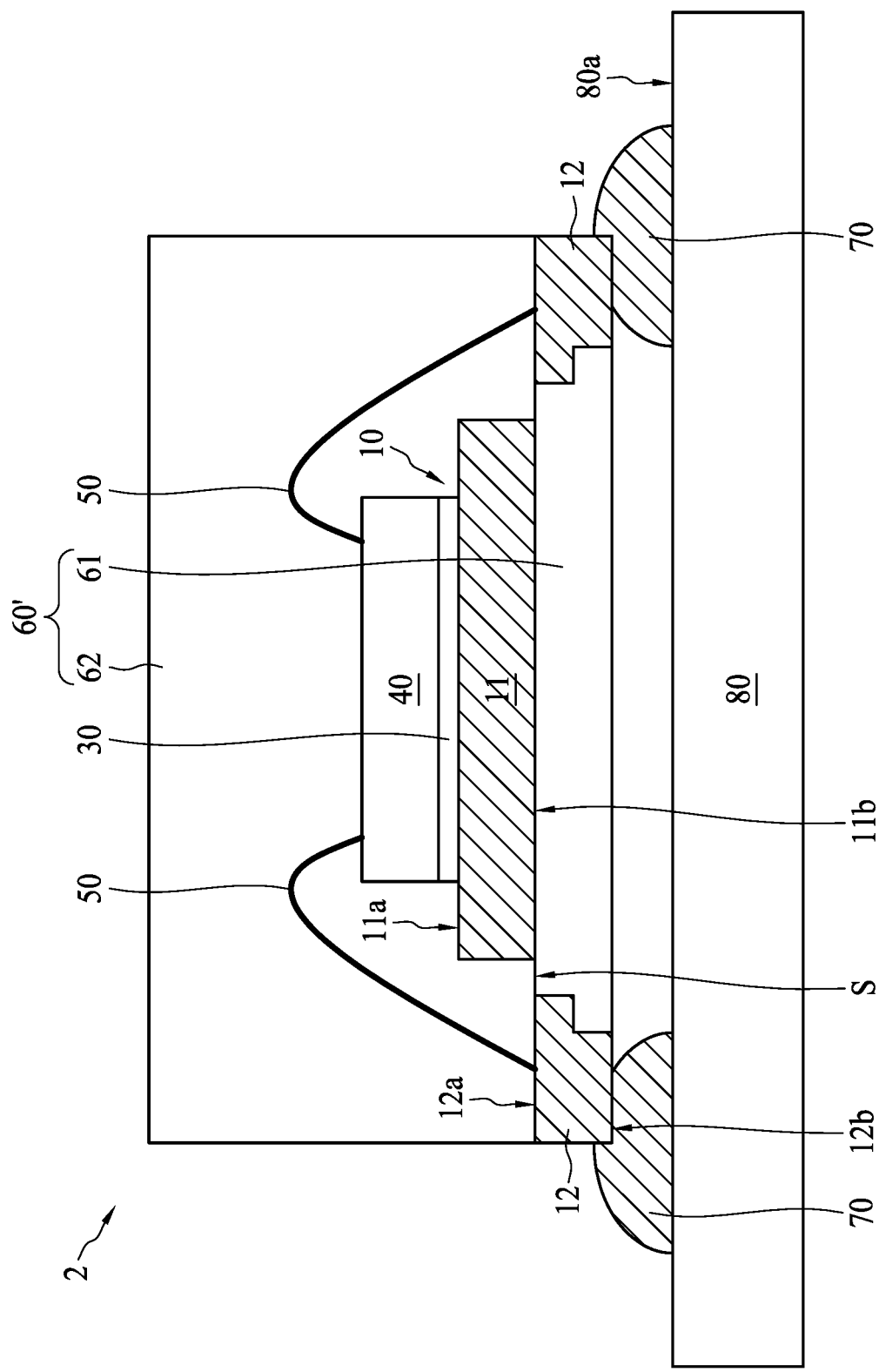

Referring to FIG. 5F, a reflow process is performed to connect the leads 12 and the bumps 70. The printed circuit board 80 is bonded to the bumps 70 so as to produce the semiconductor package structure 2. Since no bump is disposed on the surface 11b of the die paddle 11, the stress generated at the interface between the bump and the die paddle 11 is reduced. That is, the design of the surface 11b of the die paddle 11 being higher than the surface 12b of the lead 12 assists in improving the performance of the semiconductor package structure 2.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only and that practical implementations of the structures described herein can be spatially arranged in any orientation or manner, provided that the merits of embodiments of this disclosure are not deviated from by such an arrangement.

As used herein, the term "vertical" is used to refer to upward and downward directions, whereas the term "horizontal" refers to directions transverse to the vertical directions.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between the highest point and the lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a die paddle;
   a plurality of leads separated from the die paddle, each of the plurality of leads having an inner side surface facing the die paddle;
   an electronic component disposed on the die paddle; and
   a package body covering the die paddle, the plurality of leads, and the electronic component, the package body covering a bottom surface of the die paddle and the inner side surface of the plurality of leads,
   wherein the die paddle has a recess recessed from the bottom surface of the die paddle, each of the plurality of leads has a recess recessed from a bottom surface of each of the plurality of leads, and the recess of the die paddle is above each of the recesses of the plurality of leads.

2. The semiconductor package structure of claim 1, wherein the recess of the die paddle faces the recesses of the plurality of leads.

3. The semiconductor package structure of claim 2, wherein the recess of the die paddle has a horizontal portion with a level different from a level of a horizontal portion of each of the recesses of the plurality of leads, and the horizontal portion of the recess of the die paddle is substantially parallel to the horizontal portion of each of the recesses of the plurality of leads.

4. The semiconductor package structure of claim 3, wherein the recess of the die paddle has a vertical portion with a level different from a level of a vertical portion of each of the recesses of the plurality of leads, and the vertical portion of the recess of the die paddle is substantially parallel to the vertical portion of each of the recesses of the plurality of leads.

5. The semiconductor package structure of claim 1, wherein the bottom surface of the die paddle faces the recesses of the plurality of leads.

6. The semiconductor package structure of claim 5, wherein the electronic component is disposed on a top surface of the die paddle.

7. The semiconductor package structure of claim 1, wherein a surface area of the electronic component is smaller than a surface area of a top surface of the die paddle.

8. The semiconductor package structure of claim 7, wherein the die paddle has a lower portion surrounded by the recess, and a width of the electronic component is smaller than a width of the lower portion of the die paddle.

9. The semiconductor package structure of claim 1, wherein the electronic component is electrically insulated from the die paddle.

10. The semiconductor package structure of claim 9, wherein the electronic component is electrically insulated from the die paddle by an adhesive layer.

11. The semiconductor package structure of claim 10, further comprising:
a package body encapsulating the die paddle,
wherein a bottom surface of the adhesive layer is spaced apart from the package body.

12. The semiconductor package structure of claim 1, wherein the recess of the die paddle faces the recesses of the plurality of leads, the bottom surface of the die paddle faces the recesses of the plurality of leads, a surface area of the electronic component is smaller than a surface area of the top surface of the die paddle, and the electronic component is electrically insulated from the die paddle.

13. A semiconductor package structure, comprising:
a die paddle having a top surface and a bottom surface;
a plurality of leads separated from the die paddle, wherein the bottom surface of the die paddle is higher than a bottom surface of each of the plurality of leads;
an electronic component disposed on the top surface of the die paddle;
a package body encapsulating the die paddle, the plurality of leads, and the electronic component; and
a bump covering a lateral surface of one of the plurality of leads which is coplanar with a lateral surface of the package body.

14. The semiconductor package structure of claim 13, wherein a portion of the lateral surface of the one of the plurality of leads is exposed from the package body.

15. The semiconductor package structure of claim 13, wherein a portion of the bottom surface of the one of plurality of leads is exposed from the bump, wherein the bottom surface of the one of plurality of leads is coplanar with a bottom surface of the package body.

16. The semiconductor package structure of claim 15, wherein each of the plurality of leads has a recess recessed from the bottom surface of each of the plurality of leads, and the package body has a portion filling the recess of the one of the plurality of leads, and the portion of the package body is free from vertically overlapping the bump.

17. The semiconductor package structure of claim 13, wherein the bump is electrically connected to the one of the plurality of leads, and a gap is located between the bottom surface of the one of the plurality of leads and the bump along a vertical direction.

18. The semiconductor package structure of claim 17, wherein the gap is tapered along a direction from the die paddle toward the one of the plurality of leads.

19. The semiconductor package structure of claim 13, wherein the die paddle has a recess recessed from the bottom surface of the die paddle, each of the plurality of leads has a recess recessed from the bottom surface of each of the plurality of leads, and one of the recesses of the plurality of leads has a level between that of the recess of the die paddle and that of the bump.

20. The semiconductor package structure of claim 13, wherein a portion of the lateral surface of the one of the plurality of leads is exposed from the package body, a portion of the bottom surface of the one of plurality of leads is exposed from the bump, wherein the bottom surface of the one of plurality of leads is coplanar with a bottom surface of the package body, the bump is electrically connected to the one of the plurality of leads, and a gap is located between the bottom surface of the one of the plurality of leads and the bump along a vertical direction, the die paddle has a recess recessed from the bottom surface of the die paddle, each of the plurality of leads has a recess recessed from the bottom surface of each of the plurality of leads, and one of the recesses of the plurality of leads has a level between that of the recess of the die paddle and that of the bump.

* * * * *